United States Patent [19]

Weeks

[11] Patent Number: 4,630,008
[45] Date of Patent: Dec. 16, 1986

[54] DIRECT FM CRYSTAL-CONTROLLED OSCILLATOR

[76] Inventor: Richard W. Weeks, 2679 Kennedy Ave., Laramie, Wyo. 82070

[21] Appl. No.: 717,533

[22] Filed: Mar. 29, 1985

[51] Int. Cl.$^4$ ............................................. H03C 3/22
[52] U.S. Cl. ............................... 332/167; 331/116 R; 331/177 V; 332/18; 332/26; 332/30 V
[58] Field of Search ................... 332/16 T, 18, 30 V, 332/26; 331/116 R, 177 V

[56] References Cited

U.S. PATENT DOCUMENTS

| | | | |
|---|---|---|---|
| 3,256,498 | 6/1966 | Hurtig | 332/26 |
| 3,528,032 | 9/1970 | Tahmisian, Jr. et al. | 331/116 R |
| 3,747,023 | 7/1973 | Hoft et al. | 332/26 |
| 3,916,344 | 10/1975 | Enderby | 331/116 R |
| 3,995,233 | 11/1976 | Waku | 331/116 R |
| 4,088,968 | 5/1978 | Pradal et al. | 332/26 |
| 4,134,085 | 1/1979 | Driscoll et al. | 331/116 R |
| 4,224,580 | 9/1980 | Yoshisato et al. | 331/116 R |
| 4,442,415 | 4/1984 | Ashida | 332/16 T |

*Primary Examiner*—Siegfried H. Grimm
*Attorney, Agent, or Firm*—Sheridan, Ross & McIntosh

[57] ABSTRACT

A direct frequency modulation crystal-controlled oscillator circuit is provided having a configuration which minimizes the number of parts required for modulation while maintaining a linear relationship between the incoming modulation voltage and the outputted frequency. The circuit includes a tuning diode in a parallel arrangement with a tank circuit connected to the collector of a transistor. In the preferred embodiment, the tank circuit includes only an inductor. The crystal of the circuit operates in the anti-resonant mode and its impedance is much greater than that of the tank circuit. Direct frequency modulation results from the frequency change of the crystal in responding to a phase change caused by the modulation voltage applied to the tuning diode, which subsequently results in a change in the phase of a transistor collector voltage. The desired linear relationship is achieved over a frequency range by proper selection of the tuning diode wherein the non-linearity that exists between voltage and capacitance associated with the tuning diode is compensated for by the offsetting non-linearity that exists between capacitance and frequency associated with the tank circuit.

9 Claims, 4 Drawing Figures

DIRECT FM CRYSTAL-CONTROLLED OSCILLATOR

FIELD OF THE INVENTION

The present invention relates to direct frequency modulated crystal-controlled oscillators and, in particular, to such an oscillator in which the crystal operates in its anti-resonant mode and modulation is achieved by a crystal frequency change in response to a signal phase change in another part of the oscillator.

BACKGROUND INFORMATION

Numerous frequency modulated crystal oscillator circuits have been advanced in connection with providing an output frequency that is a linear function of an inputted modulation signal or voltage. In many such circuits a voltage variable capacitor or tuning diode is utilized. However, as is well known, the tuning diode is not linear over a wide range of modulation voltages. That is, the capacitance of the tuning diode does not vary linearly with the inputted voltage over a relatively wide range of voltages. To compensate for such non-linearity and thereby achieve a linear relationship over a desired range of output frequencies, circuits have been devised directed to altering the reactance of the crystal. Briefly, the non-linearity of the tuning diode is compensated for by a change in reactance of the crystal using frequency dependent passive electrical elements in series and/or in parallel with the crystal. In another type of crystal oscillator, instead of changing the reactance of the crystal to compensate for non-linearity, the oscillator includes a configuration of circuit elements wherein the series resonant frequency of the crystal changes in response to a phase change caused by the modulation signal. Regardless of the type of circuit used to maintain linearity, such known frequency modulated crystal-controlled oscillators are complex in design, include a relatively great number of electrical components in order to achieve the desired linearization, and are relatively expensive to manufacture because of the number of components required.

SUMMARY OF THE INVENTION

A frequency modulated crystal-controlled oscillator circuit is provided which includes a voltage variable capacitive element, such as a tuning diode. The circuit further includes a tank circuit including at least an inductor having a selected, predetermined inductance. The tuning diode and the tank circuit are electrically connected in parallel. The circuit also includes a crystal configured to operate in its parallel resonance or anti-resonant mode. The tank circuit is also electrically connected to the collector of a single transistor while, in one embodiment, the crystal is located in a feedback path between the collector of the transistor and its base. The transistor functions essentially as a current source in series with the tank circuit.

With the inputting of a modulation voltage, the tuning diode changes capacitance and causes a change in the phase of the transistor collector voltage. To compensate for such a phase change and for oscillations to be maintained in the circuit, the crystal frequency changes so that the resulting phase shift from the collector of the transistor to the base of the transistor and back to the collector corresponds to a zero phase shift. By means of the frequency adjustment made by the crystal operating in its anti-resonant mode, in response to the collector voltage phase change, a direct frequency modulation of the oscillator operating frequency is achieved.

A linear relationship is maintained for a desired frequency deviation by a proper selection of the tuning diode and inductor from many commercially available tuning diodes and inductors. In particular, for at least certain tuning diodes, the non-linear relationship that exists between the modulation voltage and the capacitance of the tuning diode is compensated for by an offsetting non-linear relationship that exists between the capacitance of the tank circuit and the frequency of the oscillator circuit. Accordingly, linearity between the modulation voltage and the operating frequency is maintained by an appropriate selection of the tuning diode and connecting the tuning diode in parallel with the tank circuit.

Based on the foregoing description, a number of worthwhile features of the present invention are easily seen. The circuit of the present invention provides direct frequency modulation by means of the frequency change of a crystal resulting from a phase change of a signal in another part of the circuit, such as the tank circuit phase change caused by the modulation voltage. As a result, electrical characteristics of the crystal, such as its reactance, are not changed by including additional parts in series or in parallel with the crystal terminals. In addition, the circuit of the present invention minimizes the number of parts or components required to provide a frequency modulated output by incorporating the tuning diode in the tank circuit, by operating the crystal in its anti-resonant mode, and by using a single transistor as a current source. A desired linear relationship between the incoming modulation voltage and the outputted frequency is primarily attained by the proper selection of the tuning diode which is placed in parallel with the tank circuit. Because of this parallel relationship, with a proper selection of the tuning diode, no additional capacitive element may be required for proper oscillator operation. Finally, because of the reduced number of parts, the circuit of the present invention can be made for a reduced cost and yet provide a highly reliable oscillator and frequency modulation circuit.

DETAILED DESCRIPTION OF THE PREFERRED EMBODIMENTS

Figure 1:
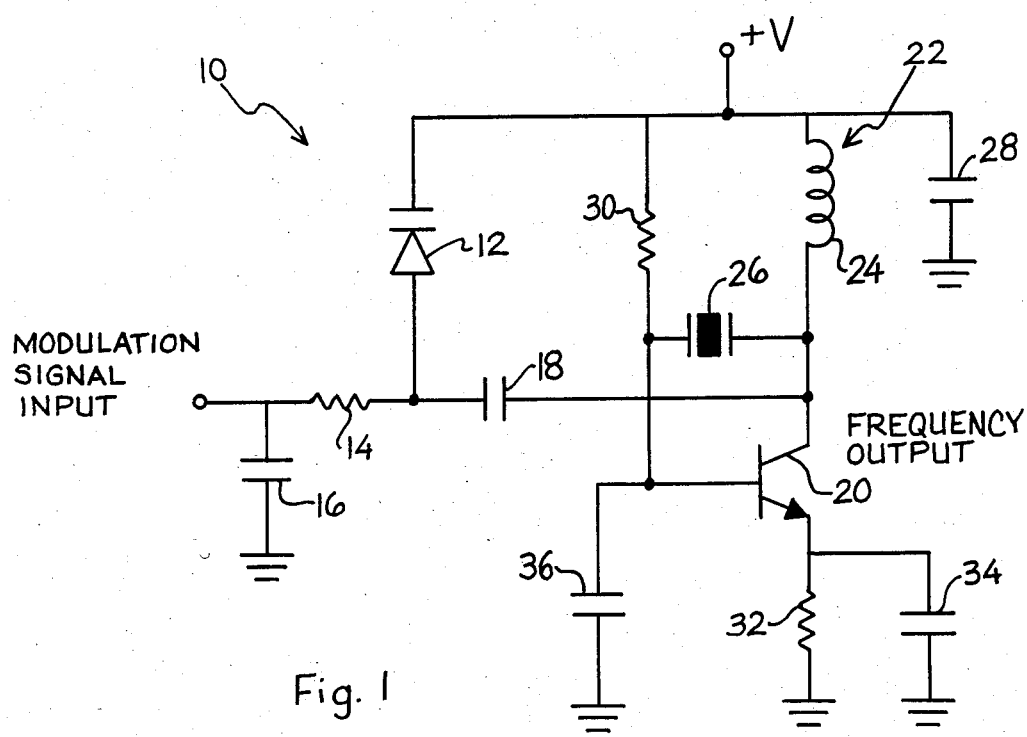
FIG. 1 is a circuit schematic of one embodiment of the present invention in which the tuning diode constitutes the entire capacitance of the tank circuit.

In accordance with the present invention a direct frequency modulation circuit is illustrated in FIG. 1 for modulating a high frequency oscillating signal to be outputted by the circuit 10. The outputted frequency of the circuit 10 is linearly related to an inputted modulation signal.

The circuit 10 includes a tuning diode 12 to which a modulation voltage signal is applied. The tuning diode 12 is a voltage variable capacitive element in which the capacitance of the tuning diode 12 is a function of the applied voltage. The anode of the tuning diode 12 is connected to an isolation resistor 14 that isolates the inputted modulation signal from the remaining or oscillator portion of the circuit 10. The isolation resistor 14 also communicates with a by-pass capacitor 16 which is used to filter out extraneous, high frequency signals. The capacity of the tuning diode is coupled to the oscillator portion of the circuit 10 by a coupling capacitor 18. The coupling capacitor 18 also communicates with the anode of the tuning diode 12. The output of the coupling capacitor 18 is applied to the collector of a transistor 20 and also to a tank circuit 22.

In the embodiment of FIG. 1, the tank circuit 22 includes only an inductor 24 and the tuning diode 12 itself since the tuning diode is in parallel with the inductor 24. The use and significance of the tuning diode 12 in parallel with the inductor 24 in the tank circuit 22 will be explained in greater detail later.

The circuit 10 also includes a crystal 26 which, in the embodiment of FIG. 1, is connected between the collector and base of the transistor 20 and provides feedback between the collector and the base of the transistor 20. The circuit 10 further includes a capacitor 28 communicating with the DC voltage source and is used as a filter to provide a path for high frequency signals. A biasing resistor 30 is also connected to the DC voltage source and to the base of the transistor 20. The biasing resistor 30 acts to provide a proper bias for the transistor 20. Resistor 32 and capacitor 34 communicate with the emitter of the transistor 20, with the resistor 32 also acting to provide a proper bias for the transistor 20 while the capacitor 34 provides an AC signal by-pass path. Lastly, the circuit 10 includes a capacitor 36 connected to the base of the transistor 20 as well as to the crystal 26. The capacitor 36 is included to ensure that a resulting phase change of zero is achieved at the collector of the transistor 20, i.e. the total phase shift around the circuit portion defined from the transistor 20 collector to the tank circuit 22 to crystal 26 to the base of the transistor 20 and back to the collector equals zero.

In connection with obtaining the desired linear relationship between the inputted modulation signal and the outputted frequency of the circuit 10, the present invention contemplates a proper selection of a tuning diode 12 from one or more commercially available tuning diodes. As previously described, in the embodiment of FIG. 1, the tuning diode 12 itself constitutes the capacitance of the tank circuit 22. To achieve this configuration, it was experimentally determined that the variation of the operating frequency due to variations of capacitance in a tank circuit, when the tank inductance was held constant, could be approximated by a second order polynomial identified as:

$$\text{frequency} = a_1 C + a_2 C^2,$$

where both $a_1$ and $a_2$ are less than 0 and C is the magnitude of the capacitance.

In conjunction with tuning diodes, it is known that the variation of the capacitance for a great number of tuning diodes, due to variations of the tuning diode reverse voltage, can also be approximated by a second order polynomial identified as:

$$C = b_1 v + b_2 v^2,$$

where $b_1$ is less than 0 and $b_2$ is greater than 0, v is the voltage applied to the tuning diode and C is the capacitance.

In view of these relationships, it was further experimentally determined that the positive curvature associated with the equation relating capacitance and modulation voltage for a tuning diode, which positive curvature is the result of the coefficient $b_2$ being greater than zero, could be offset by the tank circuit capacitance because of the negative curvature associated with the equation relating the operating frequency and the capacitance in a tank circuit as a result of coefficient $a_2$.

To select the proper tuning diode therefore with these functional relationships in mind, the following procedure is utilized. First, the tank circuit is provided with an inductor having a first inductance value. Secondly, a capacitor, having a known magnitude of capacitance, is connected in parallel across the inductor and the operating frequency for that capacitor is determined. The capacitor is then replaced by another capacitor and another operating frequency determined for that particular capacitor. This process is repeated so that a record or plot of frequency versus capacitance is obtained for a number of capacitance values. Next, a number of graphs illustrating the relationship between voltage and capacitance for a number of tuning diodes are selected. Such curves or graphs can be taken from commercially available handbooks describing the characteristics of the tuning diodes. A comparison is then made between the frequency versus capacitance plot and the tuning diode curves to find a desired linear relationship between an inputted voltage and an outputted frequency, as the capacitance varies. In the event that a proper linear relationship cannot be achieved, the first inductor is replaced by a second inductor and the process repeated until a desired linear relationship is achieved for a particular tuning diode with the then selected inductor.

The operation of the circuit 10 is next discussed particularly with regard to the frequency modulation by means of a frequency change of the crystal 26 caused by phase change of the transistor collector AC voltage as a result of a change in the modulation voltage. The crystal 26 is chosen and the electrical components communicating with the crystal 26 are provided so that the crystal 26 operates in its parallel resonance or anti-resonant mode during the frequency modulation process. Further, the transistor 20, in the embodiments of the present invention, is virtually an AC current source for driving the tank circuit 22, which is in parallel with the crystal 26 for the embodiment of FIG. 1. For oscillation to occur in a circuit of the kind of the present invention, the tank circuit 22 must be resonant at a frequency below the anti-resonant frequency of the crystal 26 and also below the operating frequency of the oscillator portion of the circuit 10. The operating frequency is that frequency which is outputted when no modulation signal is present. Because of these predetermined relationships, the tank circuit 22 is essentially capacitive at the operating frequency. Because the tank circuit 22 is capacitive, the AC voltage at the collector of the transistor 22 lags the AC collector current by some value less than 90°, i.e. $-90° + A\text{hd } T°$. The phase angle $A_T°$ exists because the tank circuit 22 has resistive losses and the minus sign associated with the $-90°$ indicates that the voltage lags the current.

The crystal 26, which operates substantially near its anti-resonant frequency but below that frequency, is equivalent to a large inductor and its impedance is much greater than the impedance of the tank circuit 22. The AC voltage at the collector of the transistor 20 drives an AC current through the crystal 26. This current lags the collector voltage by some value less than 90°, i.e. $-90°+A_B°$. The phase angle $A_b°$ exists because the crystal 26 also has some small resistive loss and the minus sign associated with the $-90°$ indicates that the current lags the voltage in this inductive element.

Considering now the combined phase shift between the collector current and the crystal current, this phase shift can be expressed as the collector tank voltage phase shift plus the crystal current phase shift, which from the foregoing is:

$$-90°+A_T°-90°+A_X°=-180°+(A_T°+A_X°). \quad (1)$$

The phase shift between the base current and collector current of the transistor 20 for the circuit 10 is slightly less than 180°, i.e. $180°-A_Q°$. For good quality transistors operating with high frequency signals, the phase angle $A_Q°$ is relatively small and, in particular, smaller than the magnitude of the combined phase shift caused by the tank circuit 22 and the crystal 26. A further phase change results due to the presence of the capacitor 36 connected to the base of the transistor 20. Because of this capacitive element, the phase of the voltage at the base of the transistor 20 lags the crystal current by some additional value, i.e. $-A_B°$.

For proper oscillations to occur in the circuit 10, the phase shift, with reference to the AC collector current, must equal zero. Accordingly, in connection with the various phase shifts previously defined, the total phase shift around the portion of the circuit 10 defined as being from the transistor 20 collector to the tank circuit 22, to the crystal 26, further to the transistor 20 base and back to the transistor 20 collector is:

$$-180°+A_T°+A_X°+180°-A_Q°=0; \text{ and}$$

$$A_T°+A_X°-A_Q°-A_B°=0.$$

In conjunction with the operation of the present invention therefore, whenever the modulation voltage changes causing a resultant change in the capacitance associated with the tuning diode 12 in the tank circuit 22, the phase of the collector voltage of the transistor 20 is changed. This occurs because, as the capacitance of the tuning diode 12 is varied, the phase angle $A_T°$ is changed. As is understood by one skilled in the art, the phase of the current through the crystal 26 operating in the anti-resonant mode shifts very rapidly in response to the frequency of the AC collector voltage of the transistor 20. That is, the crystal 26 will readjust the operating frequency in order to change the phase angle $A_X°$ and thereby compensate for the change in the phase angle $A_T°$ caused by the change in capacitance resulting from the application of the modulation signal. Such changes occur in order that the total phase shift equals zero as set forth in Equation 2 defined just above. With the crystal 26 being forced to change its frequency due to the AC collector voltage phase change, the frequency of the circuit 10 changes as a direct function of the applied modulation voltage. As previously noted, linearization between the inputted modulation voltage and the outputted frequency is achieved by the proper selection of the tuning diode 12 and connecting the tuning diode in parallel with the inductor 24.

In addition to satisfying Equation 2, for proper oscillation in the circuit 10 of FIG. 1, the current attenuation from the transistor 20 collector to the tank circuit 22—to the crystal 26—to the transistor 20 base must be less than the reciprocal of the transistor current gain, beta, at the operating frequency of the circuit 10. These two conditions relating to phase shift and current gain are identified as Barkhausen's criteria for an oscillator. In connection with the embodiment of FIG. 1, the criterion associated with current gain is satisfied by the proper choice of certain of the electrical components in the circuit 10, namely, the transistor 20, the inductor 24, the crystal 26, the capacitor 36, and the tuning diode 12.

Figure 2:
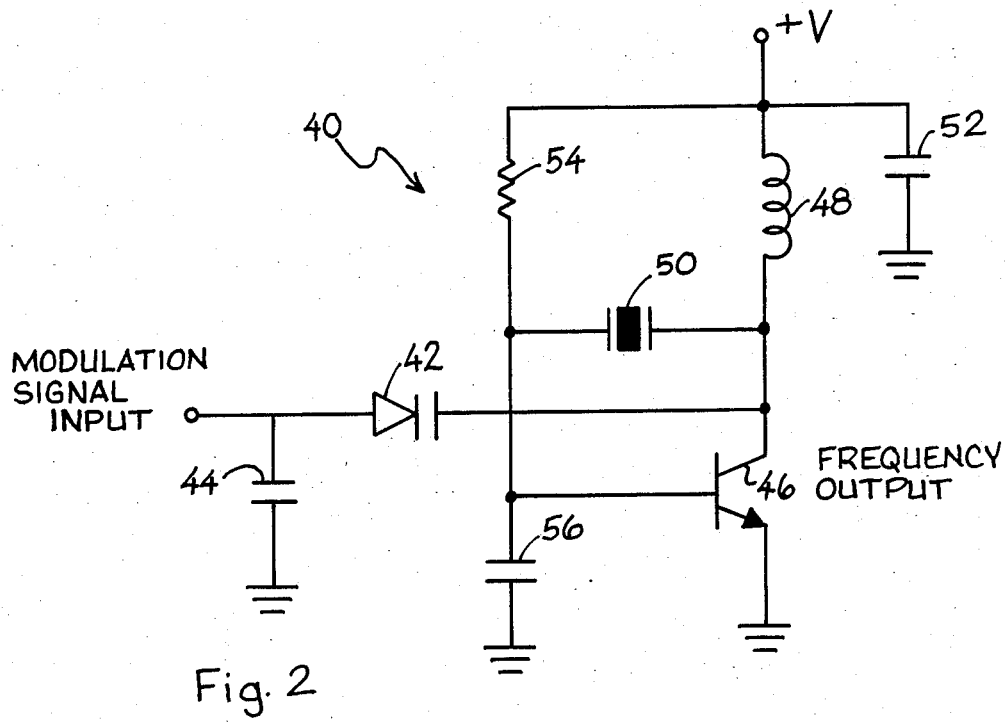
FIG. 2 illustrates a second embodiment of the circuit of the present invention in which a minimum number of electrical components are utilized.

A modified form of the circuit 10 is illustrated in FIG. 2. With reference to FIG. 2, the modified circuit 40 includes a tuning diode 42 connected at its anode to the by-pass capacitor 44 and at its cathode to the collector of transistor 46 and one side of the inductor 48. A crystal 50 communicates with the collector of the transistor 46 and provides a feedback path between the collector of the transistor 46 and its base. The circuit 40 further includes a by-pass capacitor 52 connected to the other side of the inductor 48, a biasing resistor 54 connected to the collector of the transistor 46 through the crystal 50, and the capacitor 56, which is provided to ensure proper phase shift of the signal applied to the base of the transistor 46. The modulation and linearization functions are achieved by the circuit 40 in the same manner as discussed in connection with the circuit 10 of FIG. 1. The circuit 40 illustrates that a number of electrical components or parts can be configured to provide the required direct frequency modulation of the modulation signal applied to the cathode of the tuning diode 42. Unlike the circuit 10 of FIG. 1, the bias stabilization components responding to the emitter of the transistor 46 have been eliminated. Further, although in parallel relationship with the inductor 48, only the cathode, and not the anode, of the tuning diode 42 is directly connected to the inductor 48.

Figure 3:
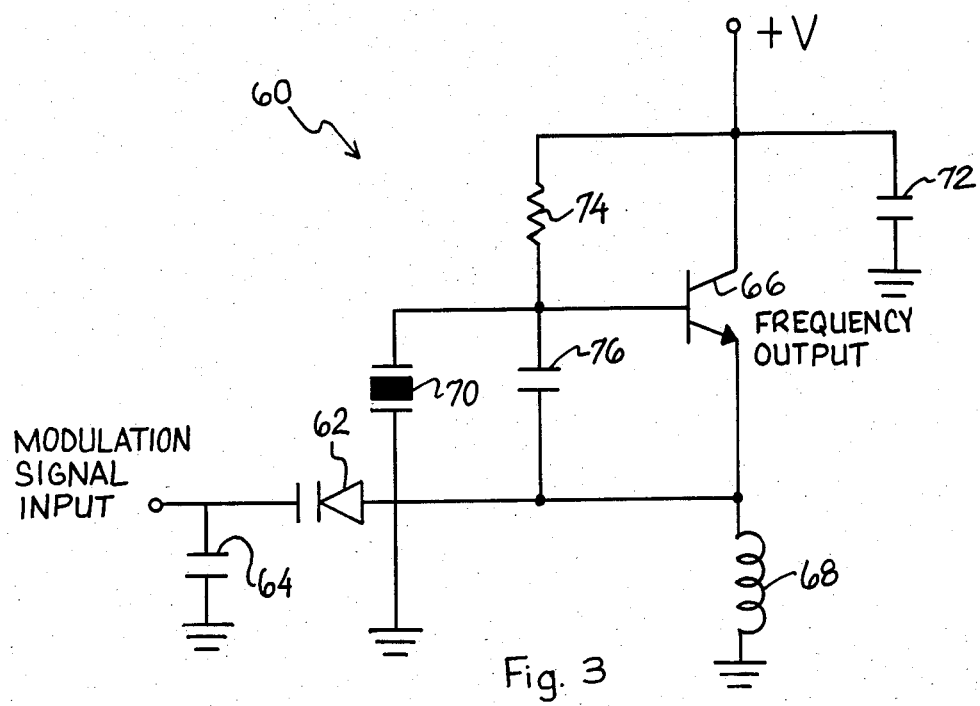
FIG. 3 illustrates a modified configuration of the circuit of FIG. 2.

An embodiment of the present invention comparable to that of FIG. 2 with a minimum number of electrical components is illustrated in FIG. 3. The direct frequency modulation circuit 60 of FIG. 3 includes a tuning diode 62 having its cathode connected to a by-pass capacitor 64 while the anode is applied to both the emitter of the transistor 66 and an inductor 68. In this embodiment, a crystal 70 is connected between the base of the transistor 20 and ground. As with the circuit 40, a by-pass capacitor 72 and a biasing resistor 74 are connected to the collector of the transistor 66 while a phase shift compensating capacitor 76 is included between the base of the transistor 66 and the emitter of the transistor 66. Unlike the embodiment of FIG. 2 also, the inductor 68 is connected to ground potential. As with the first two embodiments, the circuit 60 modulates using the inputted modulation voltage and provides an output frequency that is linearly related to the modulation voltage in accordance with the operation previously discussed in connection with FIG. 1.

Figure 4:
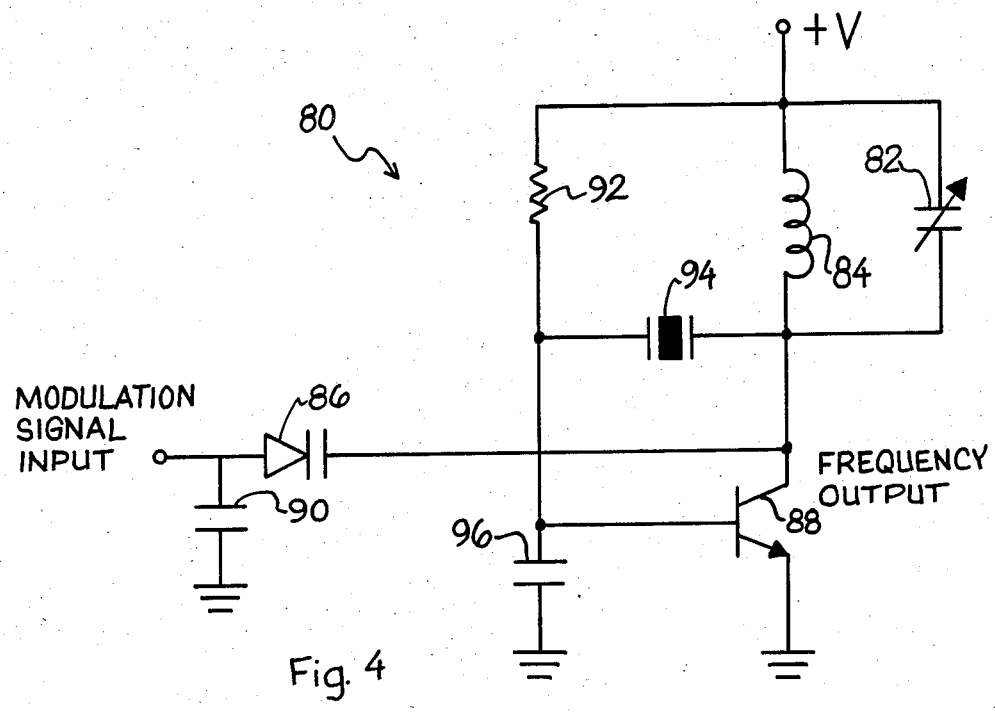
FIG. 4 is another embodiment of the present invention in which a trimming capacitor is utilized in the tank circuit.

A further embodiment of the present invention is the circuit 80 illustrated in FIG. 4. The circuit 80 is characterized by the use of a trimming capacitor 82. The trimming capacitor 82 is located in parallel relationship with the other components of the tank circuit, namely an inductor 84 and tuning diode 86. Use of the trimming capacitor 82 results in an additional electrical component to the embodiment of FIG. 2. The trimming capacitor 82 is primarily included so that the capacitance of the tank circuit can be adjusted by a minor amount to compensate for manufacturing imperfections that exist in the tuning diode 86 so that a desired linear relationship between modulation voltage and output frequency is achieved. Like the circuit 40 of FIG. 2, the circuit 80 also includes a transistor 88, a by-pass capacitor 90, a biasing resistor 92, a crystal 94, and a capacitor 96 for adjusting signal phase shift. Once the trimming capacitor 82 has been adjusted to provide an appropriate capacitance value, the circuit 80 is able to operate in the same manner as the other embodiments to provide the desired frequency modulation and linearization.

In connection with determined values of important components of a circuit of the present invention, with regard to FIG. 3, the tuning diode 62 is identified as a MV832 made by Motorola and having a nominal capacitance of 22 pf at 4 v, the crystal 70 is available from International Crystal Company and identified as part number 4763701 with a frequency range of about 72.5647–72.5687 MHz and an operating frequency of about 72.5667 MHz, the transistor 66 is identified as a 2N918, the inductor 68 has an inductance of 0.15 $\mu$h, and the capacitor 76 has a capacitance of 56 pf.

It should be understood that, although only four different but related circuit configurations have been illustrated, many additional embodiments, based on the principles of the present invention, can be designed and implemented by such modifications as substituting a PNP transistor for the NPN transistor shown in FIGS. 1–4, by using a negative power supply, and by reversing the anode and cathode connections of the tuning diodes.

Based on the foregoing description, a number of salient advantages of the present invention are readily discerned. The present invention utilizes a tuning diode in the tank circuit of an oscillator so that a phase change caused by a modulation voltage results in a crystal frequency change. As a consequence, electrical characteristics of the crystal, such as its impedance, need not be changed by including additional electrical components in series or parallel with the crystal terminals. Accordingly, a minimum number of electrical parts is required for direct frequency modulation of the inputted modulation voltage. The proper linear relationship between the applied modulation voltage and the outputted frequency is achieved by the proper selection of the tuning diode located in parallel with the tank circuit and in which the tuning diode capacitance contributes to the operation of the tank circuit. The proper selection of the tuning diode is accomplished by utilizing a compensating or offsetting relationship that exists between the voltage and capacitance of the tuning diode and the relationship between capacitance and frequency that exists in the tank circuit. Finally, in those cases in which manufacturing imperfections exist in the tuning diode and/or the inductor of the tank circuit, a trimming capacitor can be used to achieve the desired linearity.

Although the present invention has been described with reference to a plurality of embodiments, it should be readily appreciated that even further modifications and variations can be effected within the spirit and scope of this invention.

What is claimed is:

1. A direct frequency modulation crystal-controlled oscillator circuit having an operating frequency and which receives a modulation signal and outputs a frequency linearly related to the modulation signal and in which the number of components in the circuit is reduced by the use of the same components to achieve both the desired oscillation and the desired modulation, comprising:

an inductor having an impedance used in compensating for non-linearity in the circuit in order to provide an output frequency linearly related to the modulation signal;

voltage variable capacitive means in parallel electrical communication with said inductor and being responsive to the modulation signal applied to the oscillator circuit, said voltage variable capacitive means being selected having a capacitance for use both in modulating the oscillator circuit operating frequency during frequency modulation operation and for acting as a capacitive element to provide proper oscillator operation;

a crystal having a reactance and continuously operating in its anti-resonant mode; and transistor means having a collector, a base and an emitter, said transistor means acting as a current source and being electrically connected to said inductor, said voltage variable capacitive means being electrically connected between said collector and said emitter of said transistor means, and said crystal being electrically connected between said transistor base and collector.

2. A circuit, as claimed in claim 1, wherein:
said inductor is in parallel with said voltage variable capacitive means.

3. A circuit, as claimed in claim 2, wherein:
said voltage variable capacitive means includes a tuning diode.

4. A circuit, as claimed in claim 1, wherein:
said transistor means includes only a single transistor and in which said crystal is electrically connected to the base of said single transistor.

5. A circuit, as claimed in claim 1, wherein:
the terminals of said crystal are maintained free of additional electrical components used to change the reactance of said crystal.

6. A circuit, as claimed in claim 1, wherein:
said inductor is located between said collector and said emitter of said transistor means to provide a DC path for current from said emitter so that a substantially zero DC voltage drop is across said inductor.

7. A method for providing direct frequency modulation in an oscillator circuit utilizing a crystal having an operating frequency and wherein the number of components in the circuit is reduced by the use of the same components to achieve both the desired oscillation and modulation, comprising:

providing an inductor;

selecting a voltage variable capacitive means having a predetermined relationship between the voltage applied to said voltage variable capacitive means and the capacitance thereof;

providing a transistor means having a collector and an emitter;

locating said voltage variable capacitive means between said collector and said emitter of said transistor means;

using said voltage variable capacitive means as a capacitive element in the oscillator circuit for providing proper oscillator operation;

using said voltage variable capacitive means for modulating the operating frequency of the crystal;

locating said inductor between said collector and said emitter of said transistor means;

compensating for the non-linearity caused by said voltage variable capacitive means by using said inductor;

supplying DC current using said transistor means;

receiving said DC current through said inductor wherein a substantially zero DC voltage is established across said inductor;

inputting a modulation signal to the circuit; and operating the crystal in the anti-resonant mode of the crystal.

8. A method, as claimed in claim 7, further including:

maintaining the crystal free of additional electrical components which cause changes to the reactance of the crystal.

9. In a method for providing direct frequency modulation in a circuit utilizing a crystal and for providing a linear relationship between an inputted modulation signal and an outputted frequency, a process for reducing the number of the circuit components comprising:

selecting an inductor having a known magnitude of inductance;

locating a capacitor in parallel with said inductor;

varying capacitors in parallel with said inductor to obtain values of frequency depending upon the value of the capacitance of the capacitors;

providing a number of graphs illustrating the relationship between voltage and capacitance for a plurality of voltage variable capacitive means;

comparing said plurality of graphs associated with said plurality of voltage variable capacitive means with the obtained values of capacitance and frequency;

selecting a voltage variable capacitive means for providing a linear relationship between an inputted modulation signal and an outputted frequency based on the comparing; and providing a circuit using said selected inductor, said selected voltage variable capacitive means, and a capacitance value that was used in said varying step.

* * * * *